United States Patent
Chiu

(10) Patent No.: US 7,948,422 B2
(45) Date of Patent: May 24, 2011

(54) METHOD FOR CONVERTING VOLTAGE IDENTIFICATION CODE AND COMPUTER SYSTEM

(75) Inventor: Ming-Hui Chiu, Taipei (TW)

(73) Assignee: Asmedia Technology Inc., Taipei (TW)

( * ) Notice: Subject to any disclaimer, the term of this patent is extended or adjusted under 35 U.S.C. 154(b) by 0 days.

(21) Appl. No.: 12/632,680

(22) Filed: Dec. 7, 2009

(65) Prior Publication Data

US 2010/0149002 A1 Jun. 17, 2010

(30) Foreign Application Priority Data

Dec. 15, 2008 (TW) ................................ 97148821 A

(51) Int. Cl.
*H03M 1/12* (2006.01)
(52) U.S. Cl. ........................................ 341/155; 713/300
(58) Field of Classification Search .................. 341/144, 341/155

See application file for complete search history.

(56) References Cited

U.S. PATENT DOCUMENTS

| 6,535,408 | B2 | 3/2003 | Lin et al. | |
| 7,039,817 | B2 | 5/2006 | Burnham et al. | |
| 7,663,517 | B1 * | 2/2010 | Rao et al. | 341/126 |
| 2002/0075710 | A1 * | 6/2002 | Lin et al. | 363/127 |
| 2002/0194516 | A1 * | 12/2002 | Muratov et al. | 713/320 |
| 2006/0085656 | A1 * | 4/2006 | Betts-LaCroix | 713/300 |

\* cited by examiner

*Primary Examiner* — Peguy JeanPierre
(74) *Attorney, Agent, or Firm* — Kirton & McConkie; Evan R. Witt

(57) ABSTRACT

The invention relates to a method for converting a voltage identification code includes the steps as follows. A special binary code range is obtained, and N special voltage identification codes corresponding to a special command are converted to N special binary codes under a converting relation, and the N special binary codes are used as the special binary code range. A first voltage identification code is converted to a corresponding first binary code under the converting relation. In addition, the first binary code and a first preset value are used to compute to obtain a second binary code, and the second binary code is not in the special binary code range.

20 Claims, 11 Drawing Sheets

| | VID [5] | VID [4] | VID [3] | VID [2] | VID [1] | VID [0] | voltage |
|---|---|---|---|---|---|---|---|
| 38 | 1 | 1 | 1 | 1 | 0 | 1 | 1.12500 |
| 39 | 0 | 1 | 1 | 1 | 1 | 0 | 1.11250 |
| 40 | 1 | 1 | 1 | 1 | 1 | 0 | 1.10000 |
| 41 | 0 | 1 | 1 | 1 | 1 | 1 | OFF |
| 42 | 1 | 1 | 1 | 1 | 1 | 1 | OFF |
| 43 | 0 | 0 | 0 | 0 | 0 | 0 | 1.08750 |

FIG. 2B

|    | VID [6] | VID [5] | VID [4] | VID [3] | VID [2] | VID [1] | VID [0] | voltage |
|----|---------|---------|---------|---------|---------|---------|---------|---------|
| 80 | 1 | 1 | 1 | 1 | 1 | 1 | 0 | 1.10000 |
| 81 | 0 | 1 | 1 | 1 | 1 | 1 | 0 | 1.09375 |
| 82 | 1 | 0 | 1 | 1 | 1 | 1 | 1 | OFF |
| 83 | 0 | 0 | 1 | 1 | 1 | 1 | 1 | OFF |
| 84 | 1 | 1 | 1 | 1 | 1 | 1 | 1 | OFF |
| 85 | 0 | 1 | 1 | 1 | 1 | 1 | 1 | OFF |
| 86 | 1 | 0 | 0 | 0 | 0 | 0 | 0 | 1.08750 |
| 87 | 0 | 0 | 0 | 0 | 0 | 0 | 0 | 1.08125 |
| 88 | 1 | 1 | 0 | 0 | 0 | 0 | 0 | 1.07500 |

FIG. 6B

METHOD FOR CONVERTING VOLTAGE IDENTIFICATION CODE AND COMPUTER SYSTEM

FIELD OF THE INVENTION

The invention relates to a method for converting a voltage identification code and, more particularly, to a method for converting the voltage identification code supporting the same voltage regulation standard. Thus, the voltage identification code before and after a converting process and processor products supporting the voltage regulation standard are compatible.

BACKGROUND OF THE INVENTION

With the progress of science and technology, fluctuation of a core voltage (Vcore) of a microprocessor (or called central processing unit) may affect the normal work of the microprocessor. If the core voltage is too high, the microprocessor may generate more heat, have shortened lifespan, and even may be damaged. If the core voltage is too low, data may be corrupted, the computer may be down, and blue screen of death may be generated. Since the density of integration of the core voltage of the microprocessor increases continuously, manufacture craft becomes finer, and the core voltage of the microprocessor is higher and higher, power supply system with higher standard is needed.

In the early days, in a motherboard, the voltage of the microprocessor is set by a jump wire or a dual inline package (DIP) switch. When a microprocessor is assembled or replaced, a user has to plug and pull the jump wire or push the DIP switch on the motherboard to set the core voltage according to the core voltage of the microprocessor in light of a specification of the microprocessor. If the user is careless, the microprocessor and the motherboard may be burned, and this is dangerous. To solve the problem, the Intel company begins to adopt the voltage identification (VID) technique from the Pentium. The VID technique is an adaptive voltage scaling (AVS) technique, and by using the technique, the power supply voltage may be set automatically by the power supply circuit of the motherboard according to the requirement of a CPU, and the user does not need to operate it.

After that, the Intel sets a corresponding voltage regulation model (VRM) standard for each type of processor product. From the Prescott core microprocessor, the voltage regulation standard is named by a voltage regulation down (VRD), the number of the VID digits, a voltage regulation precision and a voltage regulation range in different versions of the voltage regulation standard are different, and the voltage identification code and the number corresponding to the special command such as the "OFF command" in each version of the voltage regulation standard are different. When the voltage identification code is converted using a digital circuit, the voltage identification code corresponding to the special command needs to be avoided. Thus, the voltage identification code before and after a converting process and processor products supporting the voltage regulation standard are compatible.

SUMMARY OF THE INVENTION

The invention provides a method for converting a voltage identification code including steps as follows. A special binary code range is obtained, N special voltage identification codes corresponding to a special command are converted to N special binary codes under a converting relation, and the N special binary codes are used as the special binary code range. A first voltage identification code is converted to a corresponding first binary code under the converting relation. In addition, the first binary code and a first preset value are used to compute to obtain a second binary code, and the second binary code is not in the special binary code range.

The invention further provides a computer system including a microprocessor, a pulse width modulation controller connected to the microprocessor and a voltage identification code converting circuit. The voltage identification code converting circuit includes a binary converting unit converting a first voltage identification code sent by the microprocessor to a corresponding first binary code under a converting relation and an arithmetic processing unit for obtaining a special binary code range, and N special voltage identification codes corresponding to a special command are converted to N special binary codes under a converting relation, and the N special binary codes are used as the special binary code range, and then, the first binary code and a first preset value are used to compute to obtain a second binary code, and the second binary code is not in the special binary code range.

BRIEF DESCRIPTION OF THE DRAWINGS

These and other features, aspects and advantages of the present invention will become better understood with regard to the following description, appended claims, and accompanying drawings.

FIG. 2B is a schematic diagram showing a binary converting unit achieved by an ultra high speed integrated circuit hardware descriptive language in the first embodiment;

FIG. 6B is a schematic diagram showing a binary converting unit achieved by an ultra high speed integrated circuit hardware descriptive language in the second embodiment of the invention;

DETAILED DESCRIPTION OF THE PREFERRED EMBODIMENT

Figure 1:
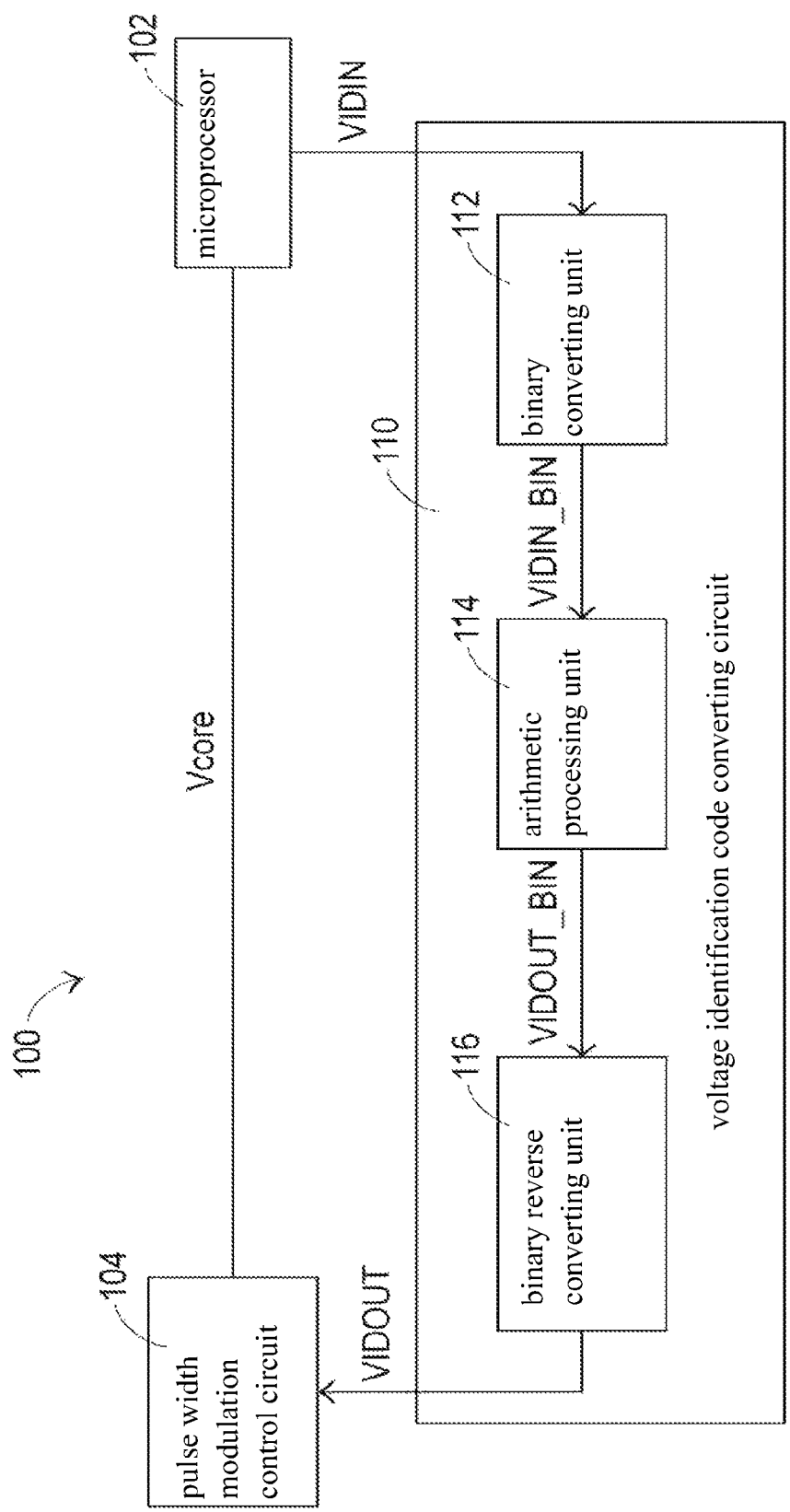
FIG. 1 is a block diagram showing a computer system in an embodiment of the invention.

FIG. 1 is a block diagram showing a computer system in an embodiment of the invention. As shown in FIG. 1, the computer system 100 includes a microprocessor 102 (or a CPU), a pulse width modulation controller 104 and a voltage identification code converting circuit 110. The voltage identification code converting circuit 110 includes a binary converting unit 112, an arithmetic processing unit 114 and a binary reverse converting unit 116.

The binary converting unit 112 converts the voltage identification code (VIDIN) belonging to a voltage regulation standard outputted by the microprocessor 102 to a corresponding binary code VIDIN_BIN under a first converting relation. Then, the arithmetic processing unit 114 obtains the number N of special voltage identification codes corresponding to a special command in the voltage regulation standard and the special binary code range BIN1~BINN (not shown) converted from the special voltage identification codes under the first converting relation and uses the binary code VIDIN_BIN and a preset value to computer to obtain a binary code VIDOUT_BIN. The binary code VIDOUT_BIN is not in the special binary code range BIN1~BINN. The BIN1 is a minimum value of the special binary code range, the BINN is a maximum value of the special binary code range, and N is a natural number. Lastly, the binary reverse converting unit 116 converts the binary code VIDOUT_BIN to the voltage identification code VIDOUT belonging to the voltage regulation standard under a second converting relation and outputs the voltage identification code VIDOUT to the pulse width modulation controller 104. The pulse width modulation controller 104 generates a voltage signal Vcore as the core voltage provided for the microprocessor.

In the following, two embodiments are given out to illustrate that the invention is used when (1) the voltage regulation standard is a voltage regulation down (VRD) Version 10 and (2) the voltage regulation standard is a VRD Expansion Version 10.

Figure 2A:
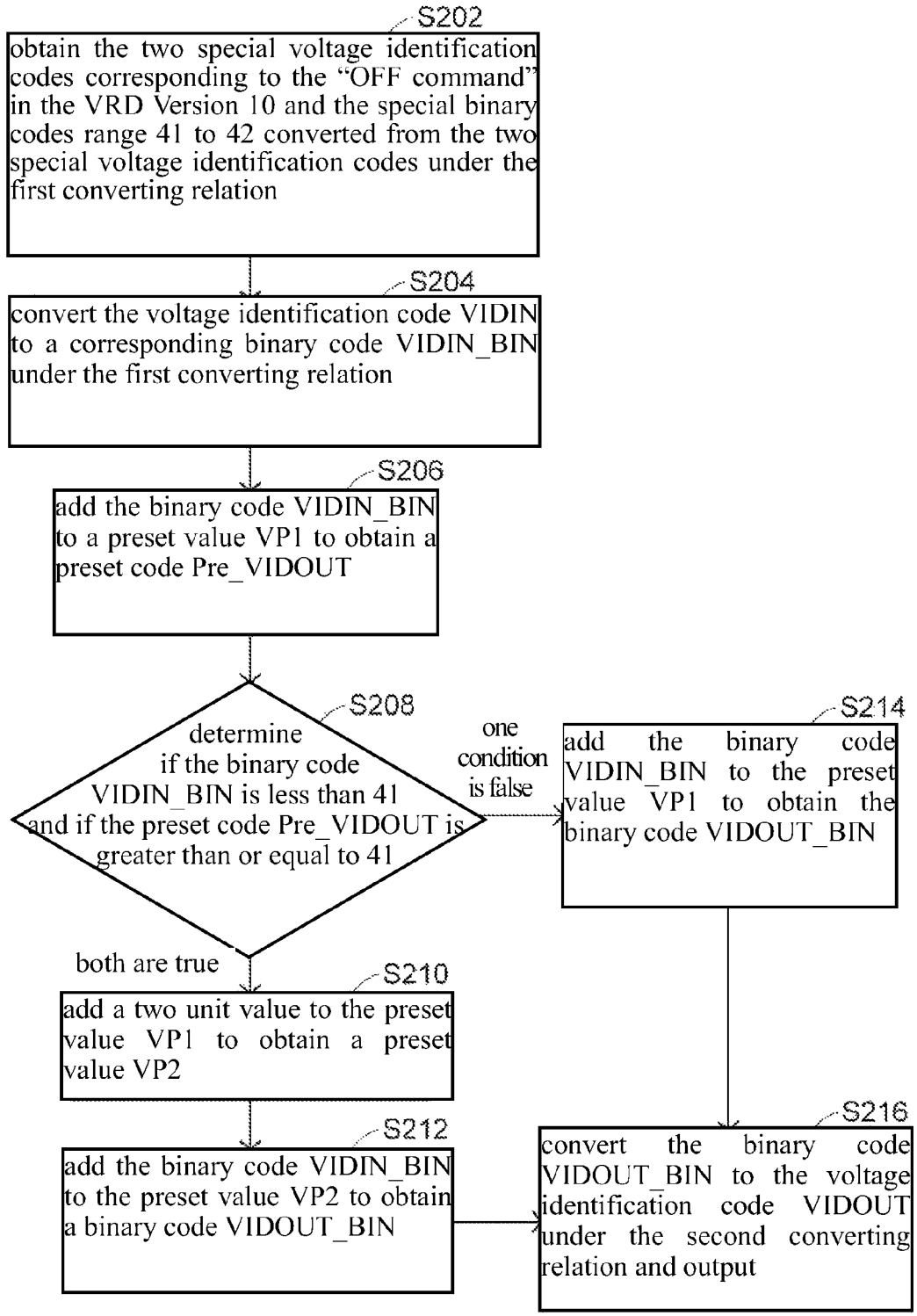
FIG. 2A is a flow path showing a first method for converting a voltage identification code in a first embodiment of the invention.

FIG. 2A is a flow path showing a first method for converting a voltage identification code in a first embodiment of the invention. As shown in FIG. 1 and FIG. 2A, in the embodiment, the voltage regulation standard is the VRD Version 10. The special command is the "OFF command", and it is used to close the microprocessor 102. The number N of the special voltage identification codes corresponding to the "OFF command" is 2, and the binary code VIDIN_BIN is added to the preset value to obtain the binary code VIDOUT_BIN.

As shown in FIG. 2A, first, the two special voltage identification codes corresponding to the "OFF command" in the VRD Version 10 and the special binary code range 41 to 42 converted from the two special voltage identification codes under the first converting relation are obtained (step S202). Then, the voltage identification code VIDIN belonging to the VRD Version 10 sent by the microprocessor 102 is converted to a corresponding binary code VIDIN_BIN under the first converting relation (step S204). The binary code VINDIN_BIN is added to the preset value VP1 to obtain a preset code Pre_VIDOUT (step S206). Whether the binary code VIDIN-BIN is less than 41 and whether the preset code Pre_VIDOUT is greater than or equal to 41 are determined (step S208). When the binary code VIDIN_BIN is less than 41 and the preset code Pre_VIDOUT is greater than or equal to 41, a two unit value is added to the preset value VP1 to obtain a preset value VP2 (step S210). Then, the binary code VIDIN_BIN is added to the preset value VP2 to obtain a binary code VIDOUT_BIN (step S212). In addition, when the binary code VIDIN_BIN is not less than 41 or the preset code Pre_VIDOUT is not greater than or equal to (that is, less than) 41, and namely one of the two determining condition is false, the binary code VIDIN_BIN is added to the preset value VP1 to obtain a binary code VIDOUT_BIN (step S214). Lastly, the binary code VIDOUT_BIN is converted to the voltage identification code VIDOUT belonging to the VRD Version 10 under the second converting relation, and the voltage identification code VIDOUT is outputted to the pulse width modulation controller 104 (step S216).

FIG. 2B is a schematic diagram showing the binary converting unit 112 and the binary reverse converting unit achieved by the Verilog code (an ultra high speed integrated circuit hardware descriptive language) in the first embodiment. Only part of the voltage identification codes of the VRD Version 10 is shown herein. As shown in FIG. 1, FIG. 2A and FIG. 2B, the binary converting unit 112 converts the voltage identification code VIDIN sent by the microprocessor 102 to the corresponding binary code VIDIN_BIN under the first converting relation. The first converting relation is as follows:

$$VIDIN\_BIN=\{VID\_in[4:0], VID\_in[5]\}-6'b01\_0101;$$

wherein the VID_in[4:0] is the front five digits of the inputted voltage identification code VIDIN, the VID_in[5] is the sixth digit of the inputted voltage identification code VIDIN, the 6' b01_0101 is a binary value having six digits. The binary reverse converting unit 116 converts the binary code VIDOUT_BIN to the voltage identification code VIDOUT belonging to the VRD Version 10 under the second converting relation. The second converting relation is as follows:

$$VIDOUT=\{(VIDOUT\_BIN+6'b01\_0101)[0],(VIDOUT\_BIN+6'b01\_0101)[5:1]\};$$

wherein the (VIDOUT_BIN+6' b 01_0101) [0] is the first digit of the result value obtained by adding the binary code VIDOUT_BIN to the binary value having six digits, and the (VIDOUT_BIN+6' b 01_0101) [5:1] is the second to the sixth digits of the result value obtained by adding the binary code to the binary value having six digits.

For example, in the six digits of the inputted voltage identification code VIDIN, when the VID [5] is 1, the VID [4] is 1, the VID [3] is 1, the VID [2] is 1, the VID [1] is 0 and the VID [0] is 1, the corresponding voltage is 1.12500 volts.

In the binary converting unit 112, the digits are disposed as {VID [4:0], VID [5]} under the first converting relation, namely "111011", and then the 6' b 01_0101 is subtracted to obtain the binary code VIDIN_BIN (38 in decimal representation).

When the preset value VP1 is 3 and an adding process is performed, according to the flow path in FIG. 2A, since the binary code VIDIN_BIN (38) is less than 41, and the preset code Pre_VIDOUT (38+3=41) is greater than or equal to 41, the preset value VP1 is added to 2 to be a preset value VP2 (5), and the binary code VIDIN_BIN (38) is added to the preset value VP2 (5) to obtain a binary code VIDOUT_BIN (43).

At last, the binary reverse converting unit 116 may add the 6' b 01_0101 under the second converting relation to dispose the digits as (VID_BIN+6,b 01_0101) [0], (VID_BIN+6' b 01_0101) [5:1] and output it. That is, in the outputted voltage identification code VID [5:0], the VID [5] is 0, the VID [4] is 0, the VID [3] is 0, the VID [2] is 0, the VID [1] is 0 and the VID [0] is 0. Thus, the corresponding voltage value is 1.08750 volts.

Figure 3A:
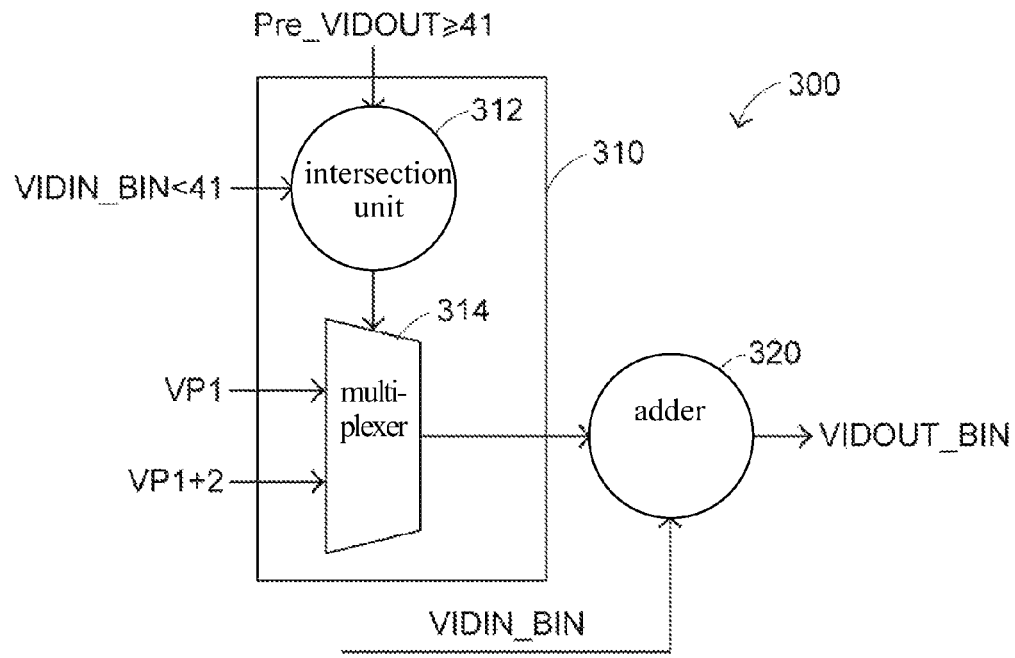
FIG. 3A is a block diagram showing an example of an arithmetic processing unit for achieving the flow path in FIG. 2A.

FIG. 3A is a block diagram showing an example of an arithmetic processing unit for achieving the flow path in FIG. 2A. As shown in FIG. 3A, the arithmetic processing unit 300 includes a selection control unit 310 and an adder 320. The selection control unit 310 includes an intersection unit 312 and a multiplexer 314. The intersection unit 312 sends a signal to the multiplexer 314 when the binary code VIDIN_BIN is less than 41 and the preset code Pre_VIDOUT is greater than or equal to 41. The multiplexer 314 adds a two unit value to the preset value VP1 and outputs the result to the adder 320. The adder 320 adds the result to the binary code VIDIN_BIN to obtain the binary code VIDOUT_BIN and output the value.

In addition, when the binary code VIDIN_BIN is not less than 41 or the preset code Pre_VIDOUT is not greater than or equal to 41, and namely, one of the two determining condition is false, the multiplexer 314 outputs the preset value VP1 to the adder 320, and the adder 320 adds the binary code VID-IN_BIN to the preset value VP1 to obtain the binary code VIDOUT_BIN.

Figure 3B:
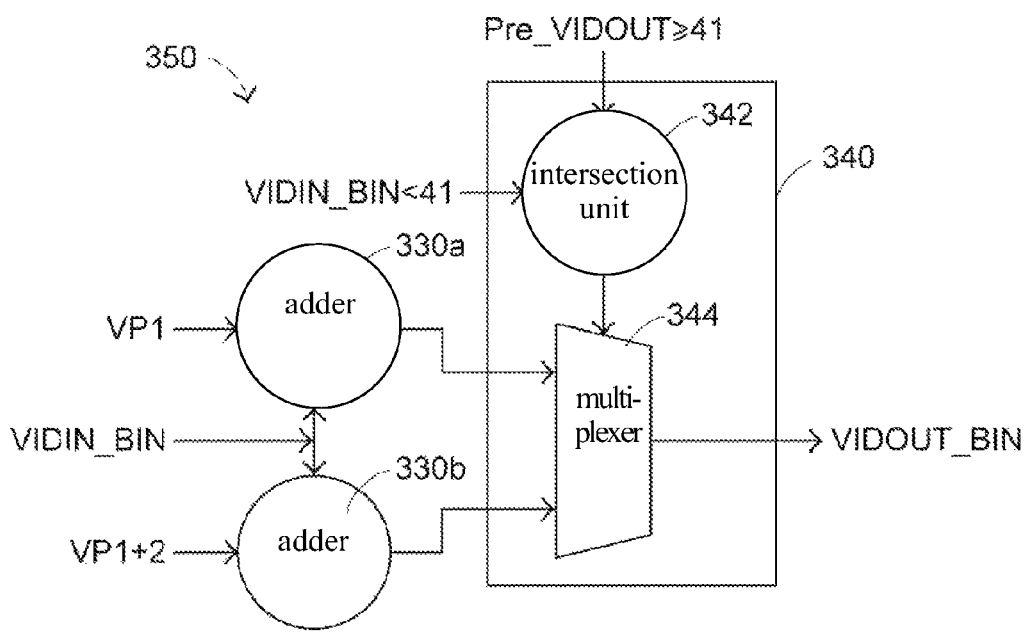
FIG. 3B is a block diagram showing another example of an arithmetic processing unit for achieving the flow path in FIG. 2A.

FIG. 3B is a block diagram showing another example of an arithmetic processing unit for achieving the flow path in FIG. 2A. The arithmetic processing unit 350 includes a selection control unit 340 and adders 330a and 330b. The selection control unit 340 includes an intersection unit 342 and a multiplexer 344. The adder 330a adds the preset value VP1 to the binary code VIDIN_BIN, and the adder 330b adds a two unit value to the preset value VP1 and then adds the result to the binary code VIDIN_BIN. When the binary code VIDIN_BIN is less than 41 and the preset code Pre_VIDOUT is greater than or equal to 41, the multiplexer 344 chooses the data sent by the adder 330b and outputs the binary code VIDOUT_BIN.

In addition, when the binary code VIDIN_BIN is not less than 41 or the preset code Pre_VIDOUT is not greater than or equal to (that is, less than) 41, and namely, one of the two determining condition is false, the multiplexer 344 chooses the data sent by the adder 330a and outputs the binary code VIDOUT_BIN.

Figure 4:
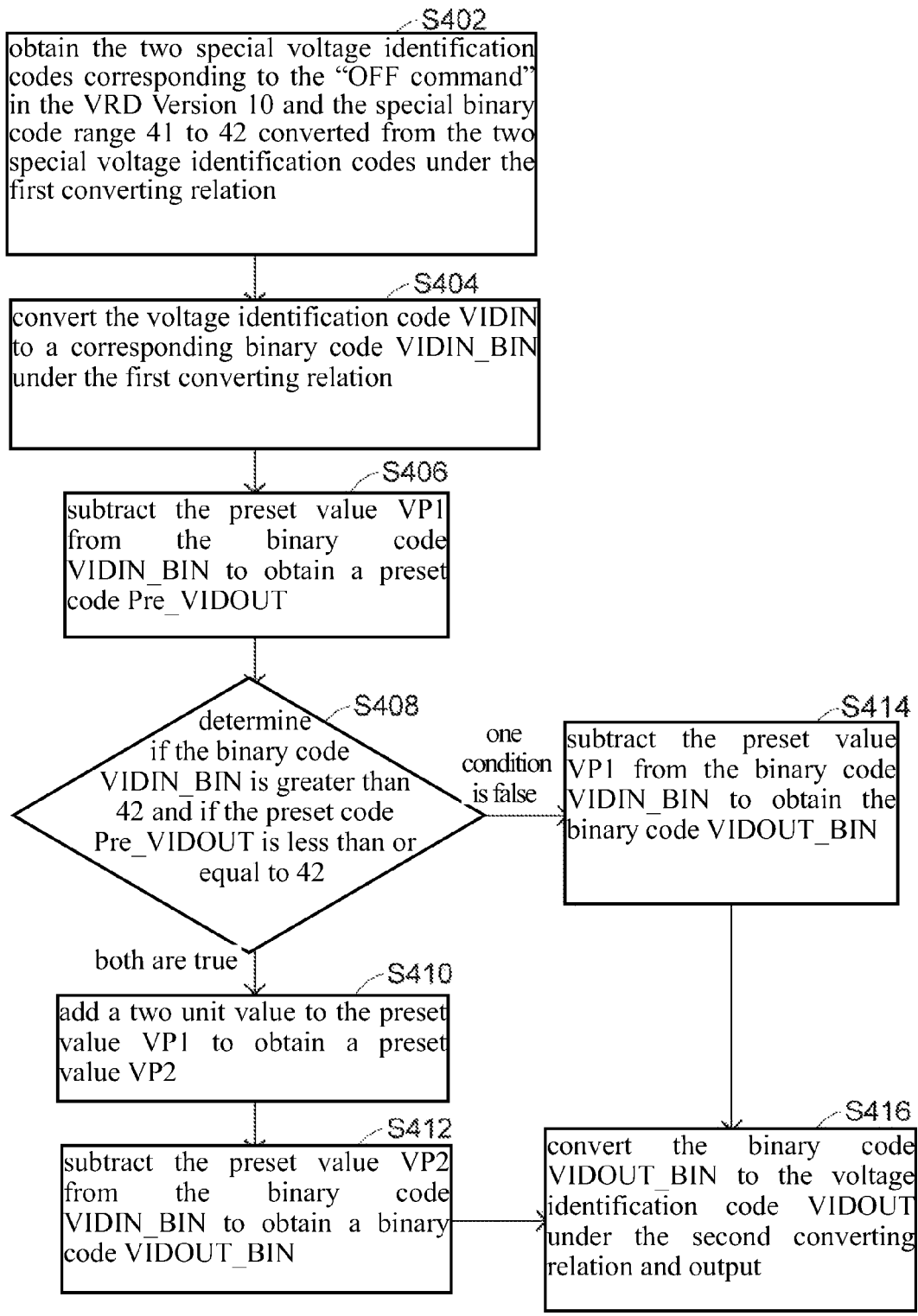
FIG. 4 is a flow path showing a second method for converting a voltage identification code in the first embodiment of the invention.

FIG. 4 is a flow chart showing a second method for converting a voltage identification code in the first embodiment of the invention. As shown in FIG. 1 and FIG. 4, the voltage regulation standard is the VRD Version 10, and the special command is the "OFF command" which is used to close the microprocessor 102. The number N of the special voltage identification codes corresponding to the "OFF command" is 2. A subtracting operation is performed on the binary code VIDIN_BIN and the preset value to obtain a binary code VIDOUT_BIN.

As shown in FIG. 4, first, the two special voltage identification codes corresponding to the "OFF command" in the VRD Version 10 and the binary code range 41 to 42 converted from the two special voltage identification codes under the first converting relation are obtained (step S402). Then, the voltage identification code VIDIN of the VRD Version 10 sent by the microprocessor 102 is converted to the corresponding binary code VIDIN_BIN under the first converting relation (step S404). The preset value VP1 is subtracted from the binary code VIND_BIN to obtain a preset code Pre_VIDOUT (step S406). Whether the binary code VIDIN_BIN is greater than 42 and whether the preset code Pre_VIDOUT is less than or equal to 42 are determined (step S408). When the binary code VIDIN_BIN is greater than 42 and the preset code Pre_VIDOUT is less than or equal to 42, a two unit value is added to the preset value VP1 to obtain a preset value VP2 (step S410). Then, the preset value VP2 is subtracted from the binary code VIDIN_BIN to obtain a binary code VIDOUT_BIN (step S412). In addition, when the binary code VIDIN_BIN is not greater than 42 or the preset code Pre_VIDOUT is less than or equal to 42, and namely, one of the two determining condition is false, the preset value VP1 is subtracted from the binary code VIDIN_BIN to obtain the binary code VIDOUT_BIN (step S414). Lastly, the binary code VIDOUT_BIN is converted to the voltage identification code VIDOUT of the VRD Version 10 under the second converting relation, and the voltage identification code VID-OUT is outputted to the pulse width modulation controller 104 (step S416).

Figure 5A:
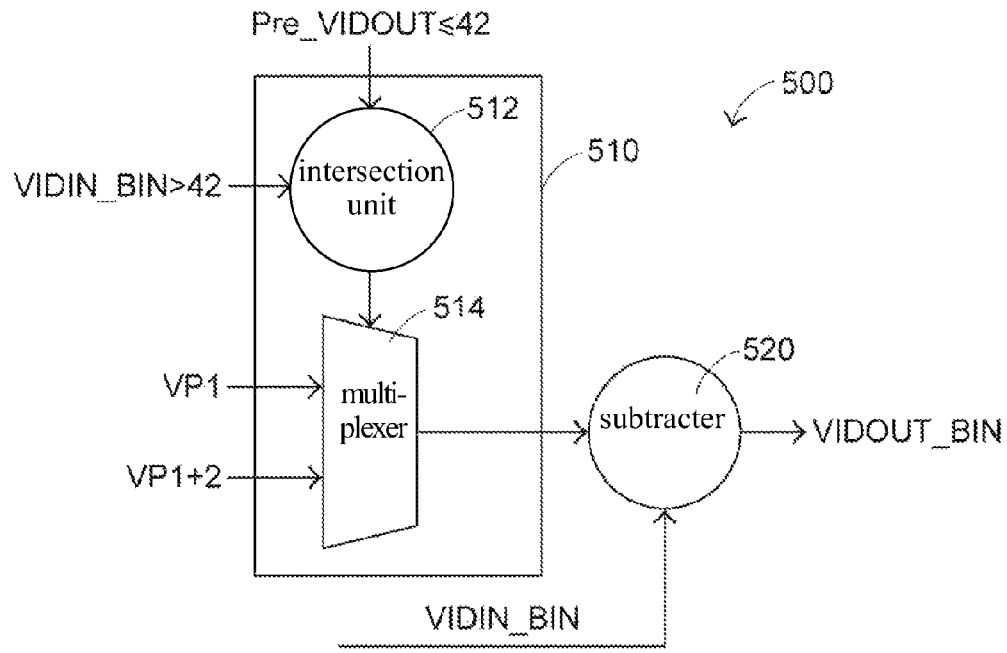
FIG. 5A is a block diagram showing an example of an arithmetic processing unit for achieving the flow path in FIG. 4.

FIG. 5A is a block diagram showing an example of an arithmetic processing unit for achieving the flow path in FIG. 4. As shown in FIG. 5A, the arithmetic processing unit 500 includes a selection control unit 510 and a subtracter 520. The selection control unit 510 includes an intersection unit 512 and a multiplexer 514. The intersection unit 512 sends a signal to the multiplexer 514 when the binary code VIDIN_BIN is greater than 42 and the preset code Pre_VID-OUT is less than or equal to 42. The multiplexer 514 adds a two unit value to the preset value VP1 and outputs the result to the subtracter 520. The subtracter 520 subtracts the result from the binary code VIDIN_BIN to obtain and output the binary code VIDOUT_BIN.

In addition, when the binary code VIDIN_BIN is not greater than 42 or the preset code Pre_VIDOUT is not less than or equal to (that is, greater than) 42, and namely, one of the two determining condition is false, the multiplexer 514 outputs the preset value VP1 to the subtracter 520, and the subtracter 520 subtracts the preset value VP1 from the binary code VIDIN_BIN to obtain the binary code VIDOUT_BIN.

Figure 5B:
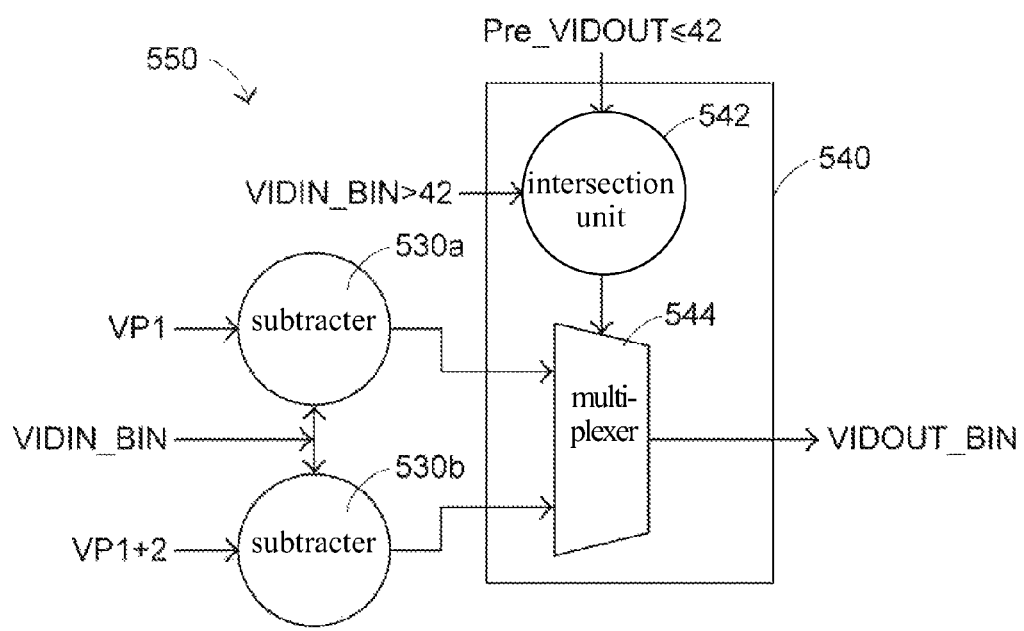
FIG. 5B is a block diagram showing another example of an arithmetic processing unit for achieving the flow path in FIG. 4.

FIG. 5B is a block diagram showing another example of an arithmetic processing unit for achieving the flow path in FIG. 4. The arithmetic processing unit 550 includes a selection control unit 540 and subtracters 530a and 530b. The selection control unit 540 includes an intersection unit 542 and a multiplexer 544. The subtracter 530a subtracts the preset value VP1 from the binary code VID-BIN, and the subtracter 530b adds a two unit value to the preset value VP1 and then subtracts the result from the binary code VIDIN_BIN. When the binary code VIDIN_BIN is greater than 42 and the preset code Pre_VIDOUT is less than or equal to 42, the multiplexer 544 chooses the data sent by the subtracter 530b and outputs the binary code VIDOUT_BIN.

In addition, when the binary code VIDIN_BIN is not greater than 42 or the preset code Pre_VIDOUT is not less than or equal to (that is, greater than) 42, and namely, one of the two determining condition is false, the multiplexer 544 chooses the data sent by the subtracter 530a and outputs the binary code VIDOUT_BIN.

Figure 6A:
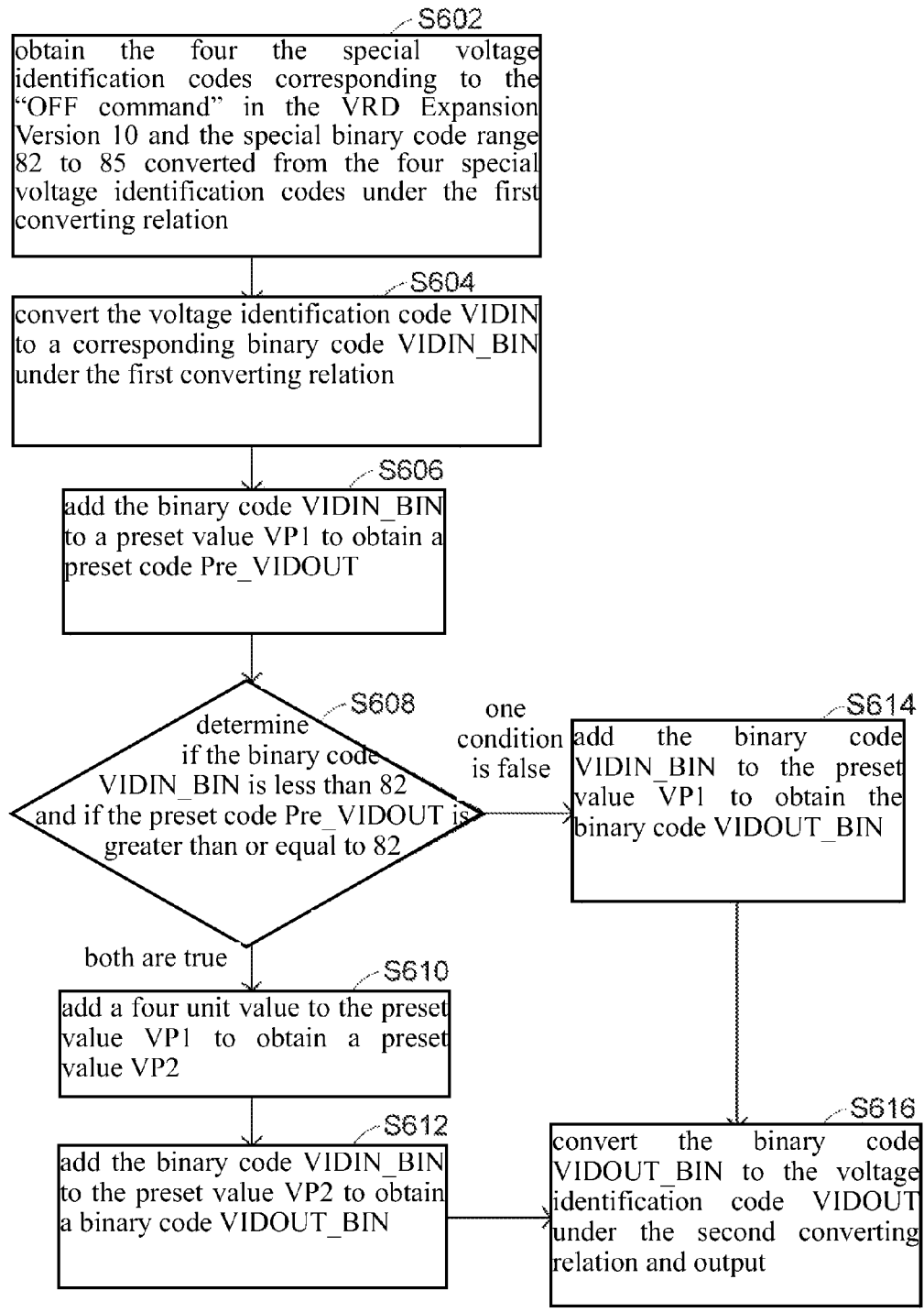
FIG. 6A is a flow path showing a first method for converting a voltage identification code in the second embodiment.

FIG. 6A is a flow path showing a first method for converting a voltage identification code in the second embodiment. As shown in FIG. 1 and FIG. 6A, in the embodiment, the voltage regulation standard is the VRD Expansion Version 10. The special command is the "OFF command", and it is used to close the microprocessor 102. The number N of the special voltage identification codes corresponding to the "OFF command" is 4, and in the example, the binary code VIDIN_BIN is added to the preset value to obtain a binary code VIDOUT_BIN.

As shown in FIG. 6A, first, the four special voltage identification codes corresponding to the "OFF command" in the VRD Expansion Version 10 and the binary code range 82 to 85 converted from the four special voltage identification codes under the first converting relation are obtained (step S602). Then, the voltage identification code VIDIN belonging to the VRD Expansion Version 10 sent by the microprocessor 102 is converted to the corresponding binary code VIDIN_BIN under the first converting relation (step S604). The binary code VIDIN_BIN is added to the preset value VP1 to obtain the preset code Pre_VIDOUT (step S606). Whether the binary code VIDIN_BIN is less than 82 and whether the preset code Pre_VIDOUT is greater than or equal to 82 are determined (step S608). When the binary code VIDIN_BIN is less than 82 and the preset code Pre_VIDOUT is greater than or equal to 82, a two unit value is added to the preset value VP1 to obtain a preset value VP2 (step S612). Then, the binary code VIDIN_BIN is added to the preset value VP2 to obtain a binary code VIDOUT_BIN (step S612). In addition, when the binary code VIDIN_BIN is not less than 82 or the preset code Pre_VIDOUT is not greater than or equal to (that is, less than) 82, and namely, one of the two determining condition is false, the binary code VIDIN_BIN is added to the preset value VP1 to obtain the binary code VIDOUT_BIN (step S614). Lastly, the binary code VIDOUT-BIN is converted to the voltage identification code VIDOUT of the VRD Expansion Version 10 under the second converting relation, and the voltage identification code VIDOUT is outputted to the pulse width modulation controller 104 (step S616).

FIG. 6B is a schematic diagram showing a binary converting unit 112 and a binary reverse converting unit 116 achieved by a Verilog code (an ultra high speed integrated circuit hardware descriptive language) in the second embodiment of the invention. Only part of the voltage identification codes in VRD Expansion Version 10 is shown herein. As shown in FIG. 1, FIG. 6A and FIG. 6B, the binary converting unit 112 converts the voltage identification code VIDIN sent by the microprocessor 102 to the corresponding binary code VIDIN_BIN under the first converting relation. The first converting relation is as follows:

$$VIDIN\_BIN=\{VID\_in[4:0], VID\_in[5], \sim VID\_in[6]\}-7'b010\_1010;$$

wherein the VID_in[4:0] is the front five digits of the first voltage identification code, the VID_in[5] is the sixth digit of the first voltage identification code, the ~VID_in[6] is the opposite phase of the seventh digit of the first voltage identification code, and the 7'b 01_0101 is a binary value having seven digits. The binary reverse converting unit 116 converts the binary code VIDOUT_BIN to the voltage identification code VIDOUT belonging to the VRD Expansion Version 10 under the second converting relation and outputs the voltage identification code VIDOUT. The second converting relation is as follows:

$$VIDOUT=\{\sim(VIDOUT\_BIN+7'b010\_1010)[0], (VIDOUT\_BIN+7'b010\_1010)[1], (VIDOUT\_BIN+7'b010\_1010)[6:2]\};$$

wherein the ~(VIDOUT_BIN+7'b 010_1010) [0] is the opposite phase of the first digit of the result value obtained by adding the binary code VIDOUT_BIN to the binary value having seven digits, the (VIDOUT_BIN+7'b 010_1010) [1] is the second digit of the result value obtained by adding the binary code VIDOUT_BIN to the binary value having seven digits, and the (VIDOUT_BIN+7'b 010_1010) [6:2] is the third to seventh digits of the result value obtained by adding the binary code VIDOUT_BIN to the binary value having seven digits.

For example, in the inputted voltage identification code VIDIN having seven digits, when the VID [6] is 1, the VID [5] is 1, the VID [4] is 1, the VID [3] is 1, the VID [2] is 1, the VID [1] is 1 and the VID [0] is 0, the corresponding voltage is 1.10000 volts. Since the digits are disposed as {VID in[4:0], VID in[5], ~VID in[6]}, namely "1111010" by the binary converting unit 112, the 7'b 010_1010 is subtracted to obtain a binary code VIDIN_BIN (80 in decimal representation). When the preset value VP1 is 4 and an adding process is performed, according to the flow path in FIG. 2A, since the binary code VIDIN_BIN (80) is less than 82, and the preset code Pre_VIDOUT (80+4=84) is greater than or equal to 82, the preset value VP1 is added to 4 to obtain a preset value VP2 (8), and the binary code VIDIN_BIN (80) is added to the preset value VP2 (8) to obtain the binary code VIDOUT_BIN (88). Lastly, the binary reverse converting unit 116 is added to the 7'b 010_1010, and the digits are disposed as {~(VIDOUT_BIN+7'b 010_1010) [0], (VIDOUT_BIN+7'b 010_1010) [1], the (VIDOUT_BIN+7'b 010_1010) [6:2]} to be outputted. That is, in the outputted voltage identification code VID [6:0], the VID [6] is 1, the VID [5] is 1, the VID [4] is 0, the VID [3] is 0, the VID [2] is 0, the VID [1] is 0 and the VID [0] is 0. Thus, the corresponding voltage value is 1.07500 volts.

Figure 7A:
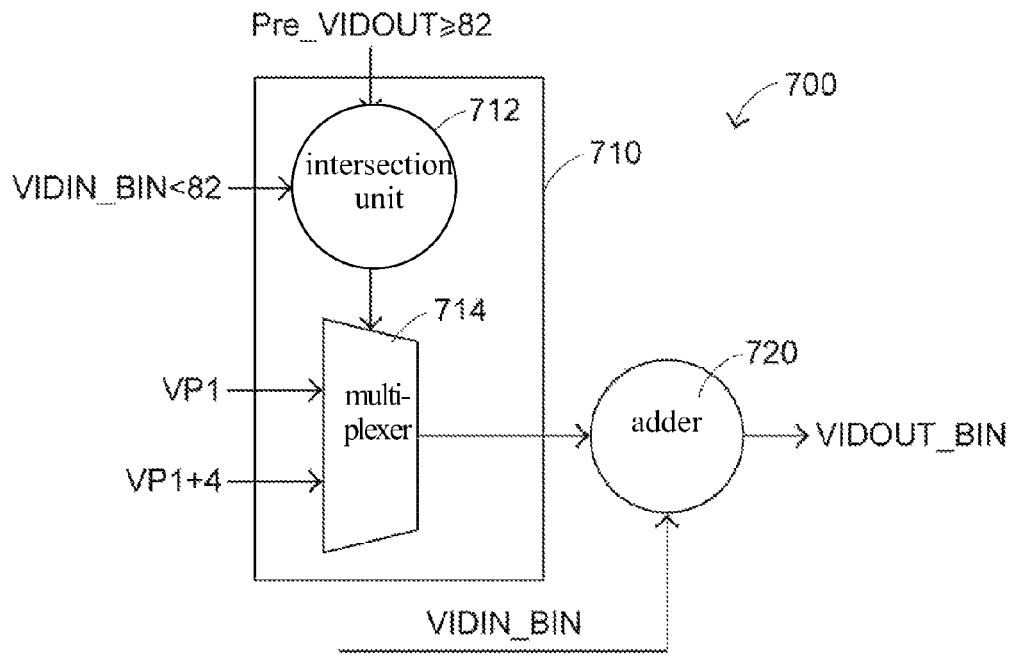
FIG. 7A is a block diagram showing an example of an arithmetic processing unit for achieving the flow path in FIG. 6A.

FIG. 7A is a block diagram showing an example of an arithmetic processing unit for achieving the flow path in FIG. 6A. As shown in FIG. 7A, the arithmetic processing unit 700 includes a selection control unit 710 and an adder 720. The selection control unit 710 includes an intersection unit 712 and a multiplexer 714. The intersection unit 712 sends a signal to the multiplexer 714 when the binary code VIDIN_BIN is less than 82 and the preset code Pre_VIDOUT is greater than or equal to 82. The multiplexer 714 adds a four unit value to the preset value VP1 and outputs the result to the adder 720. The adder 720 adds the result to the binary code VIDIN_BIN to obtain and output the binary code VIDOUT_BIN.

In addition, when the binary code VIDIN_BIN is not less than 82 or the preset code Pre_VIDOUT is not greater than or equal to (that is, less than) 82, and namely, one of the two determining condition is false, the multiplexer 714 outputs the preset value VP1 to the adder 720, and the adder 720 adds the binary code VIDIN_BIN to the preset value VP1 to obtain the binary code VIDOUT_BIN.

Figure 7B:
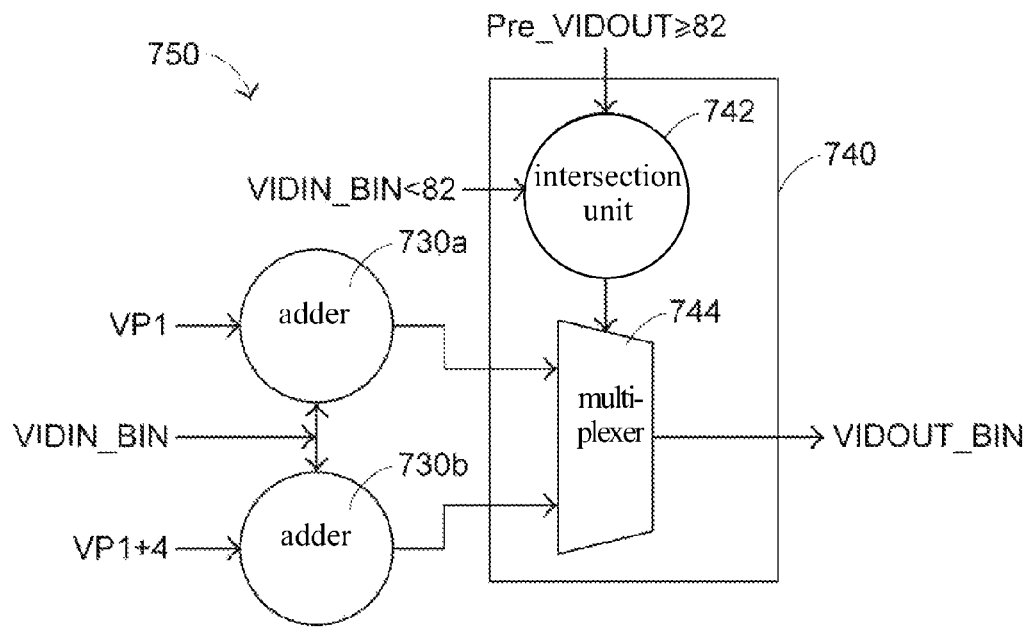
FIG. 7B is a block diagram showing another example of an arithmetic processing unit for achieving the flow path in FIG. 6A.

FIG. 7B is a block diagram showing another example of an arithmetic processing unit for achieving the flow path in FIG. 6A. The arithmetic processing unit 750 includes a selection control unit 740 and adders 730a and 730b. The selection control unit 740 includes an intersection unit 742 and a multiplexer 744. The adder 730a adds the preset value VP1 to the binary code VIDIN_BIN, and the adder 730b adds a four unit value to the preset value VP1 and then adds the result to the binary code VIDIN_BIN. When the binary code VIDIN_BIN is less than 82, and the preset code Pre_VIDOUT is greater than or equal to 82, the multiplexer 744 chooses the data sent by the adder 730b and outputs the binary code VIDOUT_BIN.

In addition, when the binary code VIDIN_BIN is not less than 82 or the preset code Pre_VIDOUT is not greater than or equal to (that is, less than) 82, and namely, one of the two determining condition is false, the multiplexer 744 chooses the data sent by the adder 730a and outputs the binary code VIDOUT_BIN.

Figure 8:
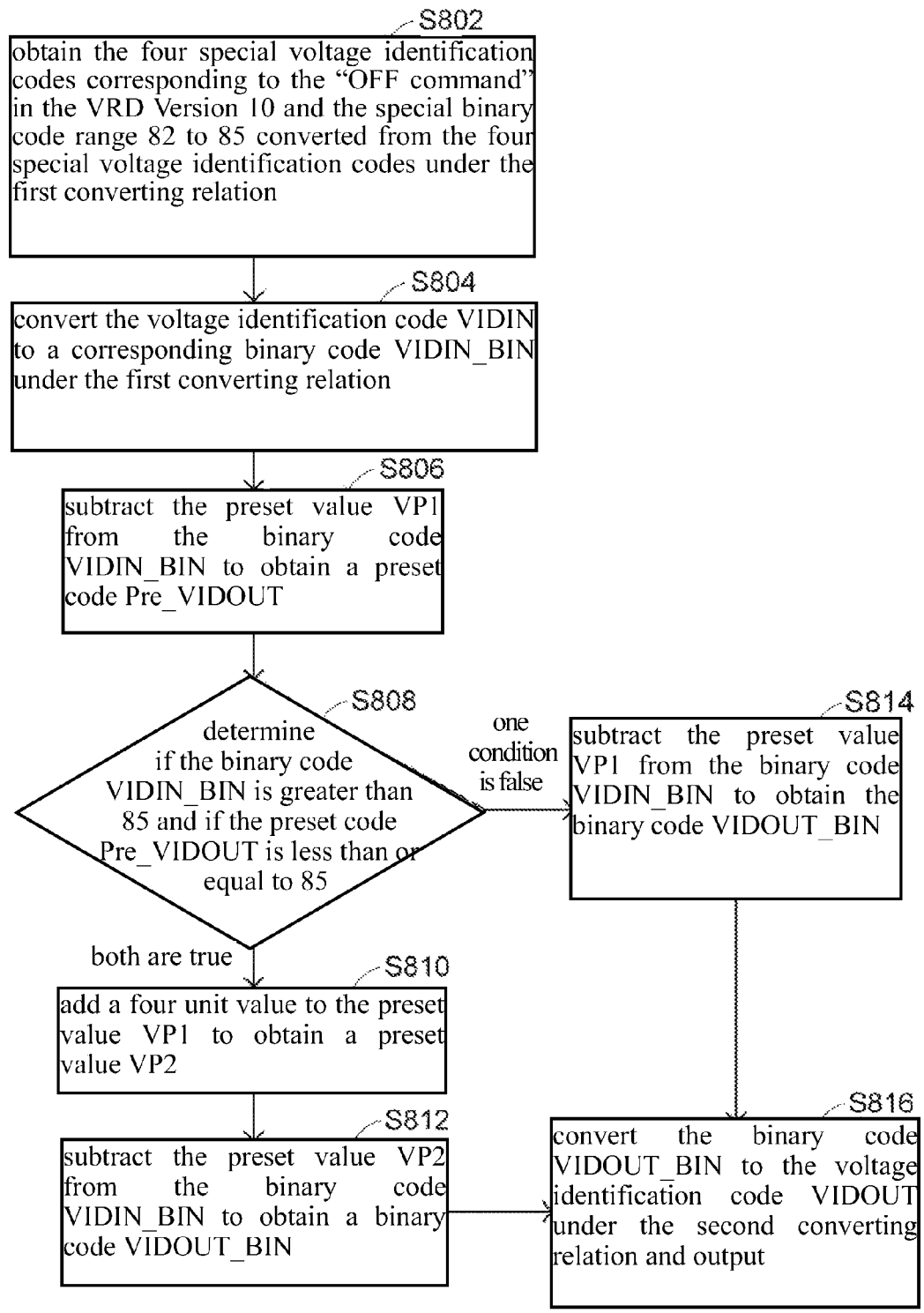
FIG. 8 is a flow path showing a second method for converting a voltage identification code in the second embodiment.

FIG. 8 is a flow path showing a second method for converting a voltage identification code in the second embodiment. As shown in FIG. 1 and FIG. 8, in the embodiment, the voltage regulation standard is the VRD Expansion Version 10. The special command is the "OFF command", and it is used to close the microprocessor 102. The number N of the special voltage identification codes corresponding to the "OFF command" is 4. In the example, the preset value is subtracted from the binary code VIDIN_BIN to obtain the binary code VIDOUT_BIN.

As shown in FIG. 8, first, the four special voltage identification codes corresponding to the "OFF command" in the VRD Expansion Version 10 and the binary code range 82 to 85 converted from the four special voltage identification codes under the first converting relation are obtained (step S802). Then, the voltage identification code VIDIN of the VRD Expansion Version 10 sent by the microprocessor 102 is converted to the corresponding binary code VIDIN_BIN (step S804). The preset value VP1 is subtracted from the binary code VIDIN_BIN to obtain a preset code Pre_VIDOUT (step S806). Whether the binary code VIDIN_BIN is greater than 85 and whether the preset code Pre_VIDOUT is less than or equal to 85 are determined (step S808). When the binary code VIDIN_BIN is greater than 85 and the preset code Pre_VIDOUT is less than or equal to 85, a two unit value is added to the preset value VP1 to obtain the preset value VP2 (step S810). Then, the preset value VP2 is subtracted from the binary code VIDIN_BIN to obtain a binary code VIDOUT_BIN (step S812). In addition, when the binary code VIDIN_BIN is not greater than 85 or the preset code Pre_VIDOUT is not less than or equal to (that is, greater than) 85, and namely, one of the two determining condition is false, the preset value VP1 is subtracted from the binary code VIDIN_BIN to obtain the binary code VIDOUT_BIN (step S814). Lastly, the binary code VIDOUT_BIN is converted to the voltage identification code VIDOUT of the VRD Expansion Version 10 under the second converting relation, and the voltage identification code VIDOUT is outputted to the pulse width modulation controller 104 (step S816).

Figure 9A:
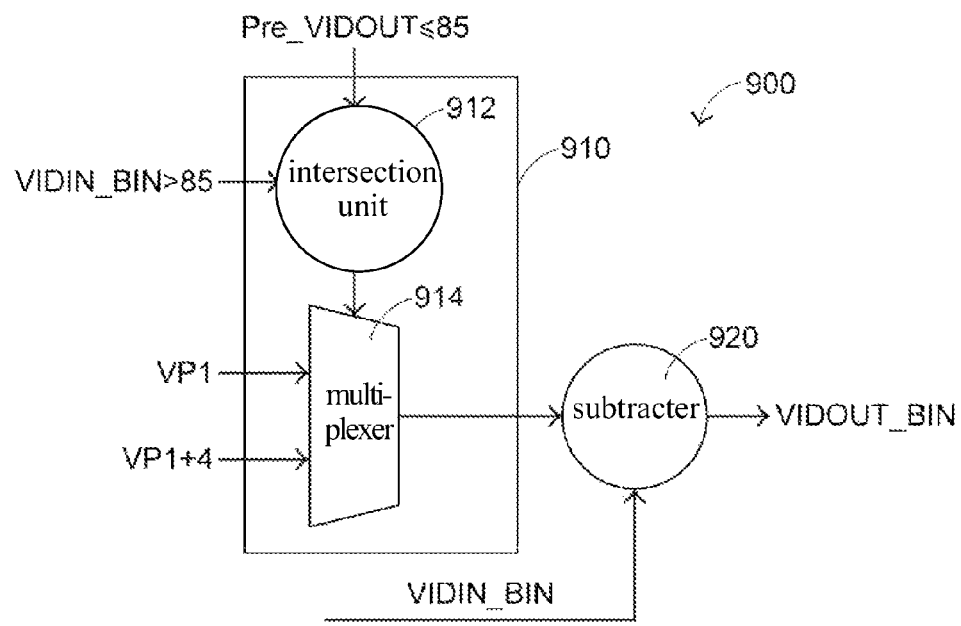
FIG. 9A is a block diagram showing an example of an arithmetic processing unit for achieving the flow path in FIG. 8.

FIG. 9A is a block diagram showing an example of an arithmetic processing unit for achieving the flow path in FIG. 8. As shown in FIG. 9A, the arithmetic processing unit 900 includes a selection control unit 910 and a subtracter 920. The selection control unit 910 includes an intersection unit 912 and a multiplexer 914. The intersection unit 912 sends a signal to the multiplexer 914 when the binary code VIDIN_BIN is greater than 85 and the preset code Pre_VIDOUT is less than or equal to 85, and the multiplexer 914 adds a four unit value to the preset value VP1 and outputs the result to the subtracter 920. The subtracter 920 subtracts the result from the binary code VIDIN_BIN to obtain and output the binary code VIDOUT_BIN.

In addition, when the binary code VIDIN_BIN is not greater than 85 or the preset code Pre_VIDOUT is not less than or equal to (that is, greater than) 85, and namely, one of the two determining condition is false, the multiplexer 914 outputs the preset value VP1 to the subtracter 920, and the subtracter 920 subtracts the preset value VP1 from the binary code VIDIN_BIN to obtain the binary code VIDOUT_BIN.

Figure 9B:
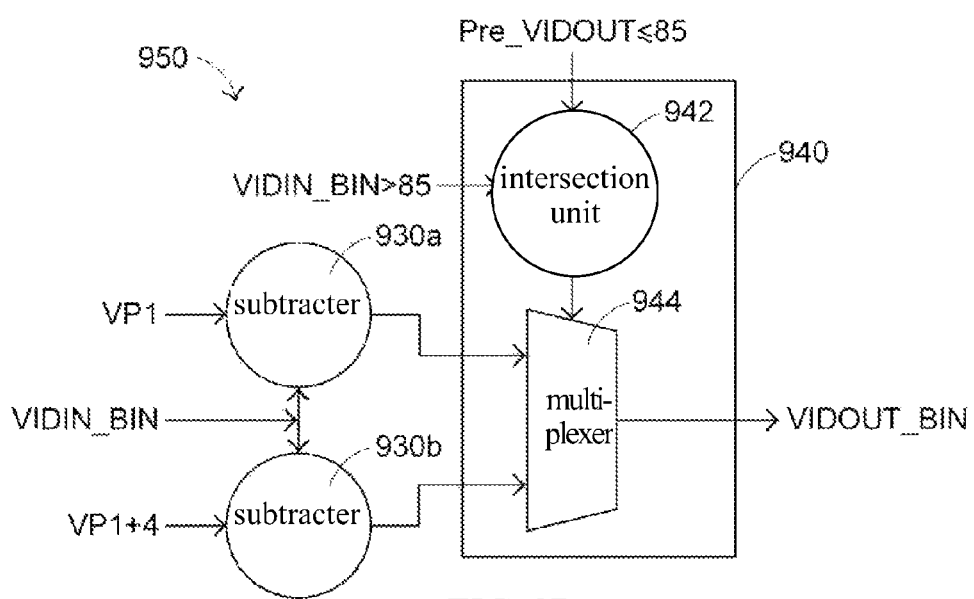
FIG. 9B is a block diagram showing another example of an arithmetic processing unit for achieving the flow path in FIG. 8.

FIG. 9B is a block diagram showing another example of an arithmetic processing unit for achieving the flow path in FIG. 8. The arithmetic processing unit 950 includes a selection control unit 940 and subtracters 930a and 930b. The selection control unit 940 includes an intersection unit 942 and a multiplexer 944. The subtracter 930a subtracts the preset value VP1 from the binary code VIDIN_BIN, and the subtracter 930b adds a four unit value to the preset value VP1 and then subtracts the result from the binary code VIDIN_BIN. When the binary code VIDIN_BIN is greater than 85, and the preset code Pre_VIDOUT is less than or equal to 85, the multiplexer 944 chooses the data sent by the subtracter 930b and outputs the binary code VIDOUT_BIN.

In addition, when the binary code VIDIN_BIN is not greater than 85 or the preset code Pre_VIDOUT is not less than or equal to (that is, greater than) 85, and namely, one of the two determining condition is false, the multiplexer 944 chooses the data sent by the subtracter 930a and outputs the binary code VIDOUT_BIN.

In addition, in the embodiment of the invention, the binary converting unit 112 converts the voltage identification code VIDIN to the corresponding binary code VIDIN_BIN under the converting relation only when the voltage identification code VIDIN is not one of the special voltage identification codes corresponding to the special command. That is, when the voltage identification code VIDIN is one of the special voltage identification codes corresponding to the special command, the special command is directly outputted to the pulse width modulation controller 104, which is the prior art and not illustrated herein.

To sum up, the voltage identification code before and after converting process and the processor product supporting the voltage regulation standard corresponding to the voltage identification code are compatible by using the method for converting the voltage identification code. Thus, the objective of the invention is achieved.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for converting a voltage identification code, comprising the steps of:

obtaining a special binary code range, wherein N special voltage identification codes corresponding to a special command are converted to N special binary codes under a converting relation, and the N special binary codes are used as the special binary code range;

converting a first voltage identification code to a corresponding first binary code under the converting relation; and using the first binary code and a first preset value to compute to obtain a second binary code, wherein the second binary code is not in the special binary code range.

2. The method for converting the voltage identification code according to claim 1, wherein the step of obtaining the second binary code by using the first binary code and the first preset value to compute further comprises the sub steps of:

adding the first binary code to the first preset value to obtain a first preset code;

determining if the first binary code is less than a minimum value in the special binary code range and if the first preset code is greater than or equal to the minimum value, respectively;

adding an N unit value to the first preset value to obtain a second preset value when the first binary code is less than the minimum value and the first preset code is greater than or equal to the minimum value; and adding the first binary code to the second preset value to obtain the second binary code.

3. The method for converting the voltage identification code according to claim 2, further comprising the step of:

adding the first binary code to the first preset value to obtain the second binary code when the first binary code is not less than the minimum value or the first preset code is less than the minimum value.

4. The method for converting the voltage identification code according to claim 1, wherein the step of obtaining the second binary code by using the first binary code and the first preset value to compute further comprises the sub steps of:
  subtracting the first preset value from the first binary code to obtain a first preset code;
  determining if the first binary code is greater than a maximum value in the special binary code range and if the first preset code is less than or equal to the maximum value, respectively;
  adding an N unit value to the first preset value to obtain a second preset value when the first binary code is greater than the maximum value and the first preset code is less than or equal to the maximum value; and
  adding the first binary code and the second preset value to obtain the second binary code.

5. The method for converting the voltage identification code according to claim 4, further comprising the step of:
  adding the first binary code to the first preset value to obtain the second binary code when the first binary code is not greater than the maximum value or the first preset code is greater than the maximum value.

6. The method for converting the voltage identification code according to claim 1, wherein the step of converting the first voltage identification code of a voltage regulation standard to the corresponding first binary code under the converting relation further comprises the steps of:
  determining if the first voltage identification code is one of the special voltage identification codes corresponding to the special command; and
  converting the first voltage identification code to the corresponding first binary code under the converting relation when the first voltage identification code is not one of the special voltage identification codes corresponding to the special command.

7. The method for converting the voltage identification code according to claim 6, wherein the voltage regulation standard is a voltage regulator down Version 10, the special command is used to close the microprocessor and N is 2, and the converting relation is as follows:

$$VIDIN\_BIN=\{VID\_in[4:0], VID\_in[5]\}-6'b01\_0101;$$

wherein the VIDIN_BIN is the first binary code, the VID_in[4:0] is the front five digits of the first voltage identification code, the VID_in[5] is the sixth digit of the first voltage identification code, and the 6' b01_0101 is a binary value having six digits.

8. The method for converting the voltage identification code according to claim 6, wherein the voltage regulation standard is a voltage regulator down Expansion Version 10.0, the special command is used to close the microprocessor and N is 4, and the converting relation is as follows:

$$VIDIN\_BIN=\{VID\_in[4:0], VID\_in[5], \sim VID\_in[6]\}-7'b010\_1010;$$

wherein the VIDIN_BIN is the first binary code, the VID_in[4:0] is the front five digits of the first voltage identification code, the VID_in[5] is the sixth digit of the first voltage identification code, the ~VID_in[6] is the opposite phase of the seventh digit of the first voltage identification code, and the 7' b 010_1010 is a binary value having seven digits.

9. The method for converting the voltage identification code according to claim 1, further comprising the steps of:
  converting the second binary code to a second voltage identification code belonging to a voltage regulation standard under a second converting relation; and
  outputting the second voltage identification code.

10. The method for converting the voltage identification code according to claim 9, wherein the voltage regulation standard is a voltage regulator down Version 10, and the second converting relation is as follows:

$$VIDOUT=\{(VIDOUT\_BIN+6'b01\_0101)[0],(VIDOUT\_BIN+6'b01\_0101)[5:1]\};$$

wherein the VIDOUT is the second voltage identification code, the VIDOUT_BIN is the second binary code, the (VIDOUT_BIN+6'b 01_0101) [0] is the first digit of the result value obtained by adding the second binary code to the binary value having six digits, the (VIDOUT_BIN+6' b 01_0101) [5:1] is the second to the sixth digits of the result value obtained by adding the second binary code to the binary value having six digits.

11. The method for converting the voltage identification code according to claim 9, wherein the voltage regulation standard is a voltage regulator down Expansion Version 10.0, and the second converting relation is as follows:

$$VIDOUT=\{\sim(VIDOUT\_BIN+7'b010\_1010)[0], (VIDOUT\_BIN+7'b010\_1010)[1],(VIDOUT\_BIN+7'b010\_1010)[6:2]\};$$

wherein the VIDOUT is the second voltage identification code, the VIDOUT_BIN is the second binary code, the ~(VIDOUT_BIN+7' b 010_1010) [0] is the opposite phase of the first digit of the result value obtained by adding the second binary code to the binary value having seven digits, the (VIDOUT_BIN+7' b 010_1010) [1] is the second digit of the result value obtained by adding the second binary code to the binary value having seven digits, the (VIDOUT_BIN+7' b 010_1010) [6:2] is the third to seventh digits of the result value obtained by adding the second binary code to the binary value having seven digits.

12. A computer system comprising:
a microprocessor;
a pulse width modulation controller connected to the microprocessor; and
a voltage identification code converting circuit, including:
  a binary converting unit converting a first voltage identification code sent by the microprocessor to a corresponding first binary code under a converting relation; and
  an arithmetic processing unit for obtaining a special binary code range, wherein N special voltage identification codes corresponding to a special command are converted to N special binary codes under the converting relation, the N special binary codes are used as the special binary code range, the first binary code and a first preset value are used to compute to obtain a second binary code, and the second binary code is not in the special binary code range.

13. The computer system according claim 12, wherein the arithmetic processing unit further comprises:
  a first adding unit for adding the first binary code to the first preset value to obtain a first preset code; and
  a selection control unit for determining if the first binary code is less than a minimum value of the special binary code range and if the first preset code is greater than or equal to the minimum value, respectively, wherein when the first binary code is less than the minimum value and the first preset code is greater than or equal to the minimum value, the selection control unit adds the first preset value to an N unit value to obtain a second preset value and adds the first binary code to the second preset value to obtain the second binary code.

14. The computer system according claim 13, wherein when the first binary code is not less than the minimum value or the first preset code is less than the minimum value, the selection control unit adds the first binary code to the first preset value to obtain a second binary code.

15. The computer system according to claim 14, wherein the voltage identification code converting circuit further comprises:
- a binary reverse converting unit using a second converting relation to convert the second binary code to a second voltage identification code and outputting the second voltage identification code to the pulse width modulation controller.

16. The computer system according to claim 12, wherein the arithmetic processing unit further comprises:
- a first subtracting unit subtracting the first preset value from the first binary code to obtain a first preset code; and
- a selection control unit determining if the first binary code is greater than a maximum value of the special binary code range and if the first preset code is less than or equal to the maximum value, respectively, wherein when the first binary code is greater than the maximum value, and the first preset code is less than or equal to the maximum value, the selection control unit adds the first preset value to an N unit value to obtain a second preset value and adds the first binary code to the second preset value to obtain the second binary code.

17. The computer system according to claim 16, wherein when the first binary code is not greater than the maximum value or the first preset code is greater than the maximum value, the selection control unit adds the first binary code to the first preset value to obtain a second binary code.

18. The computer system according to claim 12, wherein when the first voltage identification code is not one of the special voltage identification codes corresponding to the special command, the binary converting unit uses a voltage regulation standard and the converting relation to convert the first voltage identification code to the corresponding first binary code.

19. The computer system according to claim 18, wherein the voltage regulation standard is a voltage regulation down Version 10, the special command is used to close the microprocessor, N is 2, and the converting relation is as follows:

$$VIDIN\_BIN=\{VID\_in[4:0],VID\_in[5]\}-6'b01\_0101;$$

wherein the VIDIN_BIN is the first binary code, the VID_in[4:0] is the front five digits of the first voltage identification code, the VID_in[5] is the sixth digit of the first voltage identification code, and the 6' b01_0101 is a binary value.

20. The computer system according to claim 18, wherein the voltage regulation standard is a voltage regulation down Expansion Version 10.0, the special command is used to close the microprocessor, N is 4, and the converting relation is as follows:

$$VIDIN\_BIN=\{VID\_in[4:0],VID\_in[5],\sim VID\_in[6]\}-7'b010\_1010;$$

wherein the VIDIN_BIN is the first binary code, the VID_in[4:0] is the front five digits of the first voltage identification code, the VID_in[5] is the sixth digit of the first voltage identification code, the ~VID_in[6] is the opposite phase of the seventh digit of the first voltage identification code, and the 7' b010_1010 is a binary value.

* * * * *